US011972933B2

(12) United States Patent
Dogome

(10) Patent No.: US 11,972,933 B2
(45) Date of Patent: Apr. 30, 2024

(54) PLASMA PROCESSING APPARATUS AND SUBSTRATE SUPPORT OF PLASMA PROCESSING APPARATUS

(71) Applicant: Tokyo Electron Limited, Tokyo (JP)

(72) Inventor: Masahiro Dogome, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 259 days.

(21) Appl. No.: 17/368,887

(22) Filed: Jul. 7, 2021

(65) Prior Publication Data

US 2022/0013339 A1 Jan. 13, 2022

(30) Foreign Application Priority Data

Jul. 7, 2020 (JP) .................................. 2020-117340

(51) Int. Cl.
*H01J 37/32* (2006.01)
*H01L 21/683* (2006.01)
*H01L 21/687* (2006.01)

(52) U.S. Cl.
CPC .... *H01J 37/32642* (2013.01); *H01J 37/3244* (2013.01); *H01J 37/32715* (2013.01); *H01L 21/6833* (2013.01); *H01L 21/68742* (2013.01)

(58) Field of Classification Search
CPC . H01J 37/32623–32642; H01J 37/3244; H01J 37/32431–32449; H01J 37/32697–32715; H01L 21/68–6875; H01L 21/68742; H01L 21/38735

USPC ......................................................... 438/778
See application file for complete search history.

(56) References Cited

U.S. PATENT DOCUMENTS

| 11,501,995 B2* | 11/2022 | Uchida | ............... H01L 21/6831 |
| 2014/0213055 A1* | 7/2014 | Himori | ............. H01L 21/68742 438/689 |
| 2020/0219753 A1* | 7/2020 | Uchida | ............. H01L 21/68735 |
| 2020/0234981 A1* | 7/2020 | Schmid | ............... C23C 16/4401 |
| 2021/0111007 A1* | 4/2021 | Kim | .................. H01L 21/67069 |
| 2022/0122878 A1* | 4/2022 | Wu | .................... H01L 21/68714 |

FOREIGN PATENT DOCUMENTS

| JP | 2016-146472 A | 8/2016 |
| WO | 2018/222430 A2 | 12/2018 |

\* cited by examiner

*Primary Examiner* — Marcos D. Pizarro
*Assistant Examiner* — Li-Chun Tung
(74) *Attorney, Agent, or Firm* — XSENSUS LLP

(57) ABSTRACT

There is provided a substrate support of a plasma processing apparatus. The substrate support includes a wafer placement surface and a ring placement surface on which a first ring and a second ring disposed at an outer peripheral side of the first ring without overlapping with the first ring in a vertical direction are placed, with a hole at a boundary between the first ring and the second ring. The substrate support further includes a lifter pin having a first holding portion and a second holding portion, the second holding portion being unitary with and extending axially from a base end of the first holding portion and having a protruding portion protruding from an outer circumference of the first holding portion, and a driving mechanism configured to raise and lower the lifter pin.

12 Claims, 10 Drawing Sheets

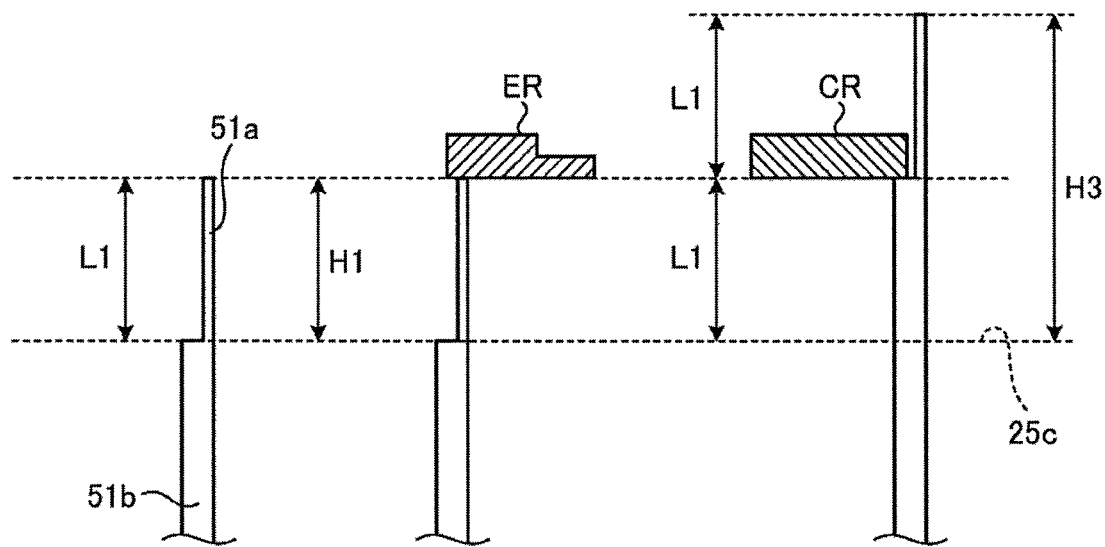
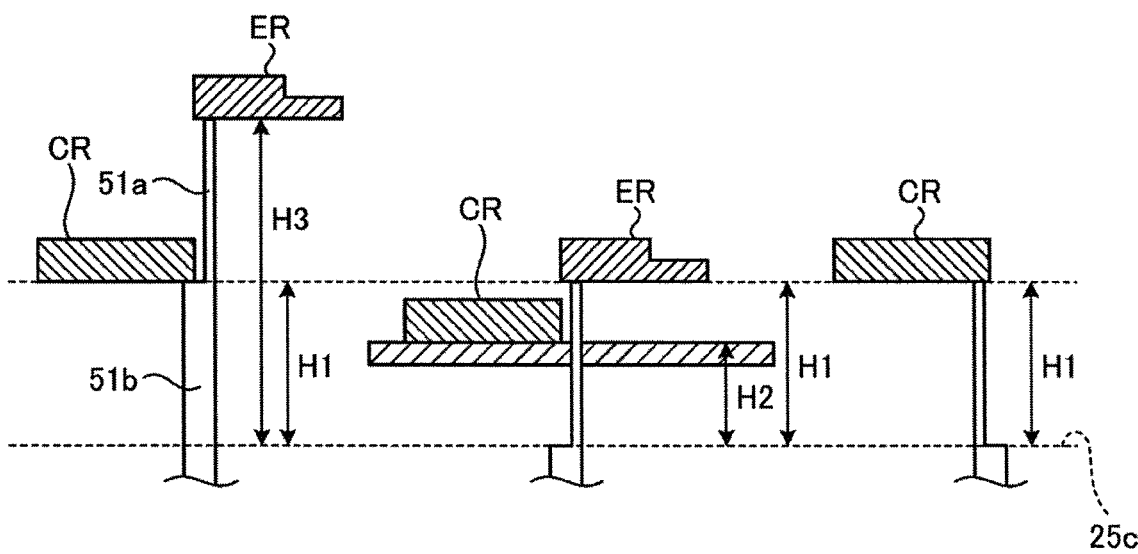

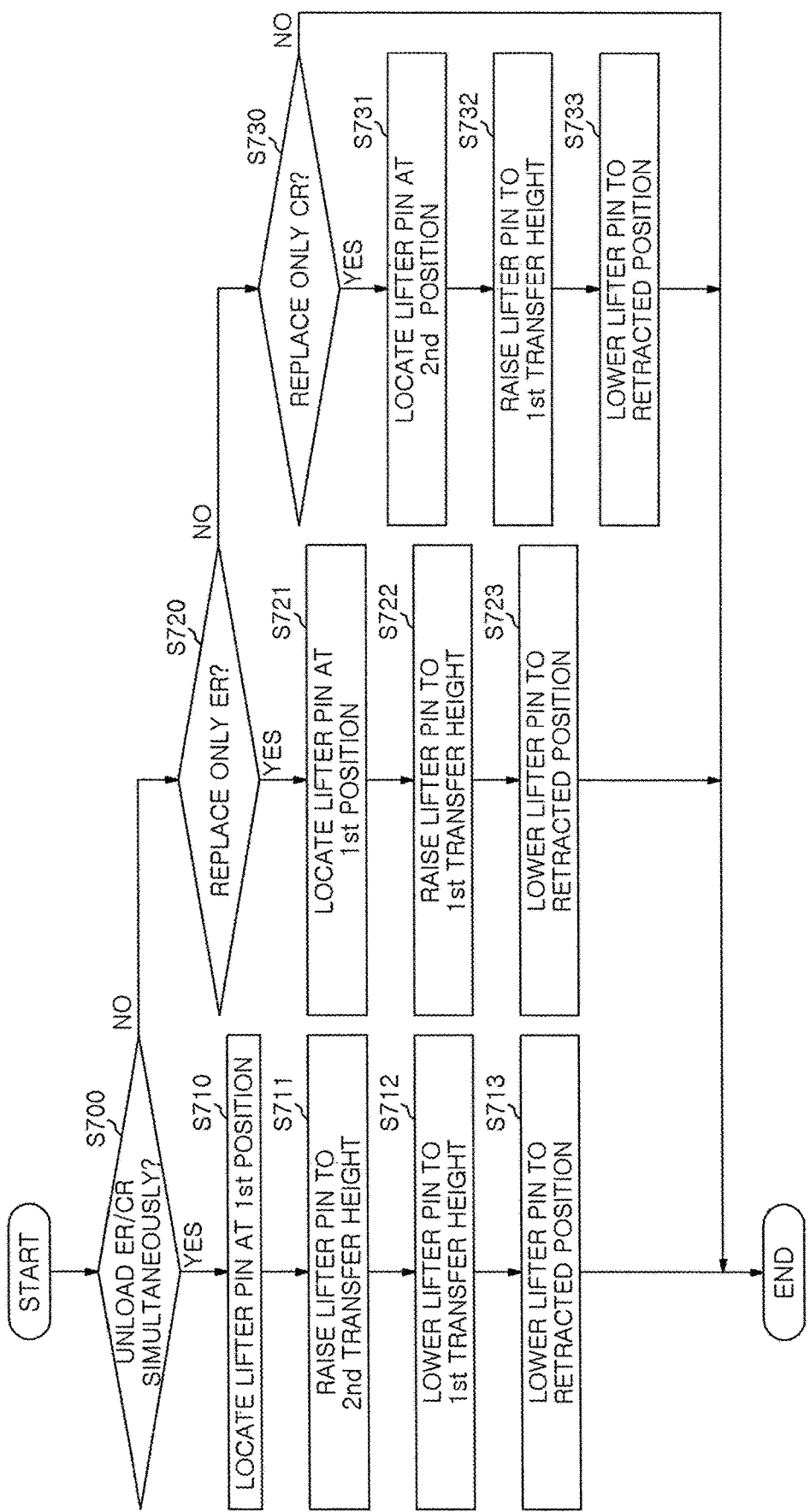

PLASMA PROCESSING APPARATUS AND SUBSTRATE SUPPORT OF PLASMA PROCESSING APPARATUS

CROSS-REFERENCE TO RELATED APPLICATION

This application claims priority to Japanese Patent Application No. 2020-117340, filed on Jul. 7, 2020, the entire contents of which are incorporated herein by reference.

TECHNICAL FIELD

The present disclosure relates to a plasma processing apparatus and a substrate support of the plasma processing apparatus.

BACKGROUND

In a system for processing a substrate such as a semiconductor wafer or the like using plasma, a ring-shaped member may be disposed near a radially outer edge of the substrate to adjust an etching rate and/or an etching profile of the plasma.

For example, in a substrate processing system disclosed in Japanese Patent Application Publication No. 2016-146472, an edge coupling ring is disposed near a radially outer edge of a pedestal in a processing chamber. The edge coupling ring is eroded by plasma during etching. Therefore, in Japanese Patent Application Publication No. 2016-146472, there is employed a configuration in which the edge coupling ring can be raised by an actuator and replaced by a robot arm.

SUMMARY

The present disclosure provides a technique for easily replacing consumable members of a plasma processing apparatus.

In accordance with an aspect of the present disclosure, there is provided a substrate support and a plasma processing apparatus including a wafer placement surface, a ring placement surface, a lifter pin and a driving mechanism. On the wafer placement surface, a wafer is placed. On the ring placement surface, a first ring and a second ring are placed. The second ring is disposed at an outer peripheral side of the first ring without overlapping with the first ring in a vertical direction. The ring placement surface has a hole at a boundary between the first ring and the second ring and is provided at an outer peripheral side of the wafer placement surface. The lifter pin has a first holding portion and a second holding portion. The second holding portion is unitary with and extending axially from a base end of the first holding portion and has a protruding portion protruding from an outer circumference of the first holding portion. The lifter pin is accommodated in the hole of the ring placement surface with the first holding portion facing the ring placement surface. The driving mechanism is configured to raise and lower the lifter pin. Therefore, in accordance with the embodiment, different rings can be held by the first holding portion and the second holding portion of one lifter pin.

BRIEF DESCRIPTION OF THE DRAWINGS

The objects and features of the present disclosure will become apparent from the following description of embodiments, given in conjunction with the accompanying drawings, in which:

FIGS. 6A to 6F explain a relationship between a length of each part of a lifter pin, a transfer height, and a thickness of the cover ring; and FIG. 7 is a flowchart showing an example of a sequence of a transfer process performed by the transfer mechanism according to the embodiment.

DETAILED DESCRIPTION

Multiple consumable members are arranged in a plasma processing apparatus. For example, an edge ring is disposed at a radially outer side of a wafer to increase uniformity of plasma processing on a wafer surface. Further, a cover ring is disposed at a radially outer side of the edge ring to protect a substrate support. When a dedicated transfer mechanism is provided for each of the consumable members to replace the consumable members, an internal structure of the substrate support becomes complicated. Further, due to a limited space in the plasma processing apparatus, a position or a size of a mechanism that can be disposed inside or below the substrate support is restricted. Therefore, it is desirable to transfer the consumable members arranged in the plasma processing apparatus using a compact configuration.

Hereinafter, the embodiments of the present disclosure will be described in detail with reference to the accompanying drawings. The respective embodiments are not restrictive, and can be appropriately combined without contradicting processing contents.

EMBODIMENT

Figure 1:
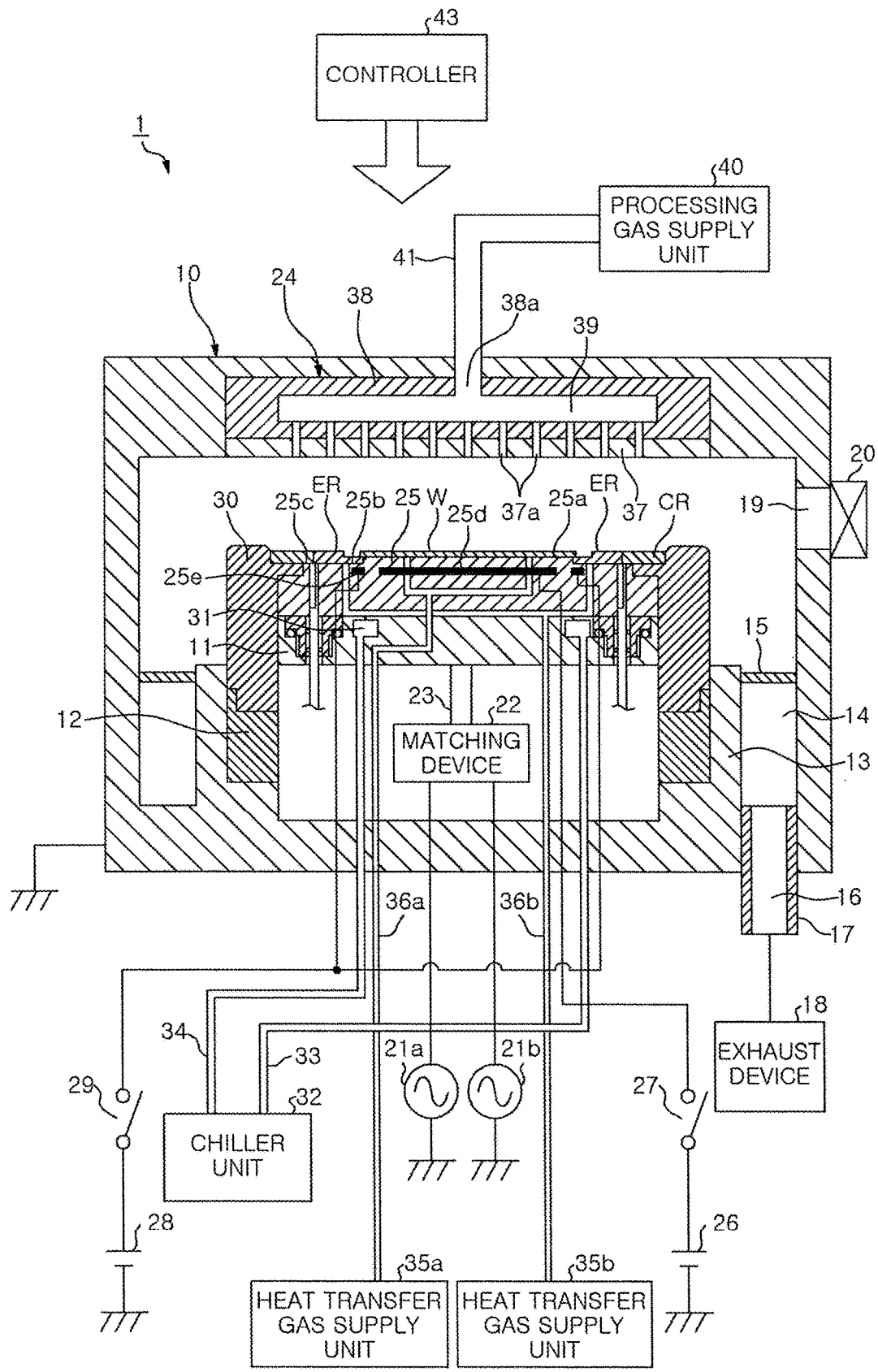
FIG. 1 is a cross-sectional view showing a schematic configuration of a plasma processing apparatus according to an embodiment.

FIG. 1 is a cross-sectional view showing a schematic configuration of a plasma processing apparatus 1 according to an embodiment. The plasma processing apparatus 1 of FIG. 1 includes a cylindrical processing chamber 10 made of metal, e.g., aluminum or stainless steel, that is frame-grounded. A circular susceptor (lower electrode) 11 on which a wafer W as a target object (substrate) is placed is disposed in the processing chamber 10. The susceptor 11 is made of, e.g., aluminum, and is supported by a cylindrical support 13 that extends vertically upward from the bottom of the processing chamber 10 via an insulating cylindrical holder 12.

An exhaust passage 14 is formed between a sidewall of the processing chamber 10 and the cylindrical support 13. An annular baffle plate 15 is disposed at an entrance or in the middle of the exhaust passage 14. An exhaust port 16 is disposed at the bottom of the processing chamber 10. An exhaust device 18 is connected to the exhaust port 16 through an exhaust line 17. Further, a gate valve 20 for opening and closing a loading/unloading port 19 for the wafer W is provided to the sidewall of the processing chamber 10.

A first and a second radio-frequency (RF) power supplies 21a and 21b are electrically connected to the susceptor 11 through a matching device 22 and a power feeding rod 23. Here, the first RF power supply 21a outputs a first RF power having a frequency (generally 40 MHz or higher) that mainly contributes to plasma generation. The second RF power supply 21b outputs a second RF power having a frequency (generally 13.56 MHz or lower) that mainly contributes to attraction of ions to the wafer W on the susceptor 11. The matching device 22 includes a first matching device for performing impedance matching between an impedance of the first RF power supply 21a side and an impedance of a load side (mainly the electrode, the plasma, and the processing chamber 10), and a second matching device for performing impedance matching between an impedance of the second RF power supply 21b side and the impedance of the load side. The voltage that contributes to the ion attraction is not limited to a radio-frequency voltage, and may be a DC voltage applied in a pulsed manner. Further, although FIG. 1 shows an example in which the first and the second RF power supplies 21a and 21b are connected to the susceptor 11, the present disclosure is not limited thereto. The first RF power supply may be connected to a shower head 24 (upper electrode) to be described later, and the second RF power supply may be connected to the susceptor 11.

Further, the shower head 24 serving as the upper electrode of a ground potential, which will be described later, is disposed at a ceiling portion of the processing chamber 10. Accordingly, the RF voltages from the first and second RF power supplies 21a and 21b are applied to between the susceptor 11 and the shower head 24.

An electrostatic chuck 25 that attracts the wafer W by an electrostatic attractive force is disposed on an upper surface of the susceptor 11. The electrostatic chuck 25 has a disc-shaped central portion 25a on which the wafer W is placed, an annular inner peripheral portion 25b, and an annular outer peripheral portion 25c. The central portion 25a projects upward with respect to the inner peripheral portion 25b and the outer peripheral portion 25a. The inner peripheral portion 25b and the outer peripheral portion 25c are substantially on the same plane. The central portion 25a is an example of a wafer placement surface on which the wafer W is placed. Further, the inner peripheral portion 25b is an example of a ring placement surface on which an edge ring ER is placed. Further, the outer peripheral portion 25c is an example of a ring placement surface on which a cover ring CR is placed. Hereinafter, the structure on which the wafer W is placed, including the susceptor 11 and the electrostatic chuck 25, is also referred to as "substrate support."

The edge ring ER is a ring-shaped member made of a conductive material such as silicon or the like. The edge ring ER has a function of improving the performance of plasma processing by making plasma distribution on the wafer surface during the plasma processing uniform. The cover ring CR is a ring-shaped member made of an insulating material such as quartz or the like. The cover ring CR has a function of protecting the susceptor 11, the electrostatic chuck 25, and the like. Further, an insulating member 30 is disposed at an outer diameter side of the cover ring CR to protect the susceptor 11. The edge ring ER is an example of a first ring. The cover ring CR is an example of a second ring. The first ring and the second ring are made of, e.g., different materials, as described above. The edge ring ER and the cover ring CR will be further described later.

The central portion 25a of the electrostatic chuck 25 is formed by interposing an electrode plate 25d made of a conductive film between dielectric films. Further, the inner peripheral portion 25b is formed by interposing an electrode plate 25e made of a conductive film between dielectric films. A DC power supply 26 is electrically connected to an electrode plate 25d through a switch 27. A DC power supply 28 is electrically connected to an electrode plate 25e through a switch 29. Then, the electrostatic chuck 25 attracts and holds the wafer W by the electrostatic force such as the Coulomb force or the like generated by a voltage applied from the DC power supply 26 to the electrode plate 25d. Further, the electrostatic chuck 25 attracts and holds the edge ring ER by the electrostatic force such as the Coulomb force or the like generated by a voltage applied from the DC power supply 28 to the electrode plate 25e.

Further, an annular coolant space 31 extending in a circumferential direction is formed in the susceptor 11. A coolant, e.g., cooling water, having a predetermined temperature is supplied from a chiller unit 32 and circulated in the coolant chamber 31 through lines 33 and 34, and a temperature of the wafer W on the electrostatic chuck 25 is controlled by a temperature of the coolant.

Further, a heat transfer gas supply unit 35a is connected to the electrostatic chuck 25 through a wafer gas supply line 36a. Further, a heat transfer gas supply unit 35b is connected to the electrostatic chuck 25 through a ring gas supply line 36b. The wafer gas supply line 36a reaches the central portion 25a of the electrostatic chuck 25. The ring gas supply line 36b reaches the inner peripheral portion 25b of the electrostatic chuck 25. Further, a common heat transfer gas supply unit may be connected to the wafer gas supply line 36a and the ring gas supply line 36b. The heat transfer gas supply unit 35a supplies a heat transfer gas to a space between the central portion 25a of the electrostatic chuck 25 and the wafer W through the wafer gas supply line 36a. Further, the heat transfer gas supply unit 35b supplies the heat transfer gas to a space between the inner peripheral portion 25b of the electrostatic chuck 25 and the edge ring ER through the ring gas supply line 36b. A thermally conductive gas, e.g., He gas or the like is preferably used as the heat transfer gas.

The shower head 24 disposed at the ceiling includes an electrode plate 37 at the bottom thereof having multiple gas injection holes 37a and an electrode holder 38 detachably holding the electrode plate 37. Further, a buffer space 39 is disposed in the electrode holder 38, and a gas supply line 41 from a processing gas supply unit 40 is connected to a gas inlet port 38a of the buffer space 39.

The individual components of the plasma processing device, such as the exhaust device 18, the RF frequency power supplies 21a, 21b, the electrostatic chuck switches 27 and 29, the DC power supplies 26 and 28, the chiller unit 32, the heat transfer gas supply units 35a and 35b, the processing gas supply unit 40, and the like are connected to a controller 43. The controller 43 controls the individual components of the plasma processing apparatus.

The controller 43 includes a central processing unit (CPU) and a storage device such as a memory or the like (all not shown), and performs a desired process in the plasma processing apparatus by reading and executing a program and a processing recipe stored in the storage device.

Further, the controller 43 is connected to a transfer mechanism 50 (see FIG. 2) to be described below. The controller 43 controls the transfer mechanism 50 to execute a process for transferring the edge ring ER and the cover ring CR.

(Example of the Transfer Mechanism 50)

Figure 2:
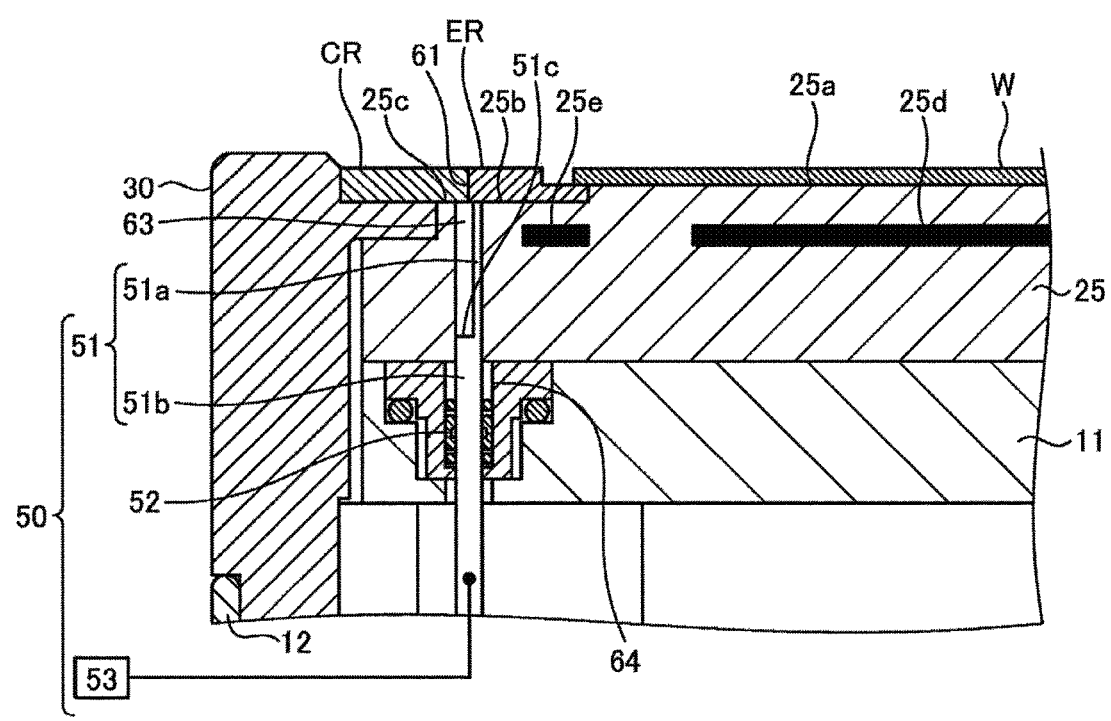
FIG. 2 is a cross-sectional view showing a schematic configuration of a transfer mechanism according to an embodiment.

FIG. 2 is a cross-sectional view showing a schematic configuration of the transfer mechanism 50 according to an embodiment. The plasma processing apparatus according to the embodiment includes the transfer mechanism 50 for transferring the edge ring ER and the cover ring CR placed on the substrate support. The transfer mechanism 50 includes lifter pins 51, a sealing portion 52, and a driving mechanism 53.

In the example of FIG. 2, the wafer W is placed on the central portion 25a of the electrostatic chuck 25, and the edge ring ER is placed on the inner peripheral portion 25b. The cover ring CR is placed on the outer peripheral portion 25c. When they are placed on accurate positions on the substrate support, the outer peripheral surface of the edge ring ER faces the inner peripheral surface of the cover ring CR with a predetermined clearance interposed therebetween. Although it is not illustrated in the drawing, a positioning structure may be provided at a portion where the inner peripheral surface of the cover ring CR and the outer peripheral surface of the edge ring ER face each other. For example, irregularities engaging each other may be formed on the inner peripheral portion 25b and the outer peripheral portion 25c and the surfaces of the edge ring ER and the cover ring CR facing the inner peripheral portion 25b and the outer peripheral portion 25c, respectively.

A hole 63 is formed in the electrostatic chuck 25 to correspond to the boundary between the inner peripheral portion 25b and the outer peripheral portion 25c. The hole 63 penetrates through the electrostatic chuck 25 in a vertical direction. The hole 63 has a substantially circular cross section. Further, a hole 64 is formed in the susceptor 11 to communicate with the hole 63.

The lifter pin 51 is stored in the holes 63 and 64 and connected to the driving mechanism 53 at a lower side thereof. Hereinafter, the end portion of the lifter pin 51 closes to the driving mechanism 53 is referred to as "base end" and the end portion opposite to the base end is referred to as "far end (or top portion)." The sealing portion 52 is disposed in the hole 64. The lifter pin 51 extends downward past the sealing portion 52. The sealing portion 52 prevents communication between the space above the sealing portion 52 and the space below the sealing portion 52 in the holes 63 and 64. The sealing portion 52 is, e.g., shaft seal, a bellows, or the like.

The driving mechanism 53 raises and lowers the lifter pin 51. The type of the driving mechanism 53 is not particularly limited. The driving mechanism 53 is, e.g., a piezo actuator, a motor, or the like.

The lifter pin 51 has a first holding portion 51a and a second holding portion 51b. The first holding portion 51a is disposed on the far end side of the lifter pin 51. The first holding portion 51a has a predetermined length L1 (see FIG. 6A) from the far end (upper end) of the lifter pin 51. The second holding portion 51b is disposed on the base end side of the lifter pin 51. The second holding portion 51b is unitary with and extending axially/downwardly from a base end of the first holding portion 51a. The second holding portion 51b is formed such that the cross-sectional area thereof becomes greater than that of the first holding portion 51a. Therefore, the second holding portion 51b forms a protruding portion 51c protruding from an outer circumference of the first holding portion 51a. The protruding portion 51c indicates a portion forming a surface capable of holding the edge ring ER or the cover ring CR on a far end surface of the second holding portion 51b.

The second holding portion 51b has a cross section that fits into the hole 63 with a predetermined clearance. When the horizontal cross section of the second holding portion 51b is viewed from the bottom in a state where the lifter pin 51 is accommodated in the hole 63, the cross section of the second holding portion 51b overlaps with a part of each of the edge ring ER and the cover ring CR. On the other hand, when the horizontal cross section of the first holding portion 51a is viewed from the top in a state where the lifter pin 51 is located at the first position, the horizontal cross section of the first holding portion 51a overlaps with only a part of the edge ring ER. On the other hand, when the lifter pin 51 is located at a second position, the cross section of the first holding portion 51a overlaps with only a part of the cover ring CR. For example, when the first holding portion 51a is located at a central side of the electrostatic chuck 25, the position of the first holding portion 51a is set to the first position. Further, when the first holding portion 51a is located at an outer peripheral side of the electrostatic chuck 25, the position of the first holding portion 51a is set to the second position. For example, the second position is obtained by rotating the lifter pin 51 located at the first position by 180 degrees about the axis.

The specific shapes of the first holding portion 51a and the second holding portion 51b are not particularly limited. For example, the first holding portion 51a may be a rod having a semicircular cross section, and the second holding portion 51b may be a rod having a circular cross section that is substantially twice the cross section of the first holding portion 51a. The cross sections of the top portions of the first holding portion 51a and the second holding portion 51b are set to have a size that allows the edge ring ER and the cover ring CR to be supported separately.

Further, the first holding portion 51a and the second holding portion 51b may have a polygonal cross section. Further, the ratio of the cross-sectional areas of the first holding portion 51a and the second holding portion 51b is not particularly limited. However, the far end surface of the first holding portion 51a and the far end surface of the second holding portion 51b are formed to satisfy the following conditions.

(1) When the lifter pin 51 located at the first position is raised, the far end surface of the first holding portion 51a is in contact with only the edge ring ER.

(2) When the lifter pin 51 located at the first position is raised, the far end surface of the second holding portion 51b is in contact with only the cover ring CR.

(3) When the lifter pin 51 located at the first position is raised, the first holding portion 51a is first brought into contact with the edge ring ER and, then, the second holding portion 51b is in contact with the cover ring CR.

(4) When the lifter pin 51 located at the second position is raised, the far end surface of the first holding portion 51a is in contact with only the cover ring CR.

(5) When the lifter pin 51 located at the second position is raised, the far end surface of the second holding portion 51b is in contact with only the edge ring ER.

(6) When the lifter pin 51 located at the second position is raised, the first holding portion 51a is first brought into contact with the cover ring CR and, then, the second holding portion 51b is in contact with the edge ring ER.

(Transfer Example of the Edge Ring ER)

Figure 3A:
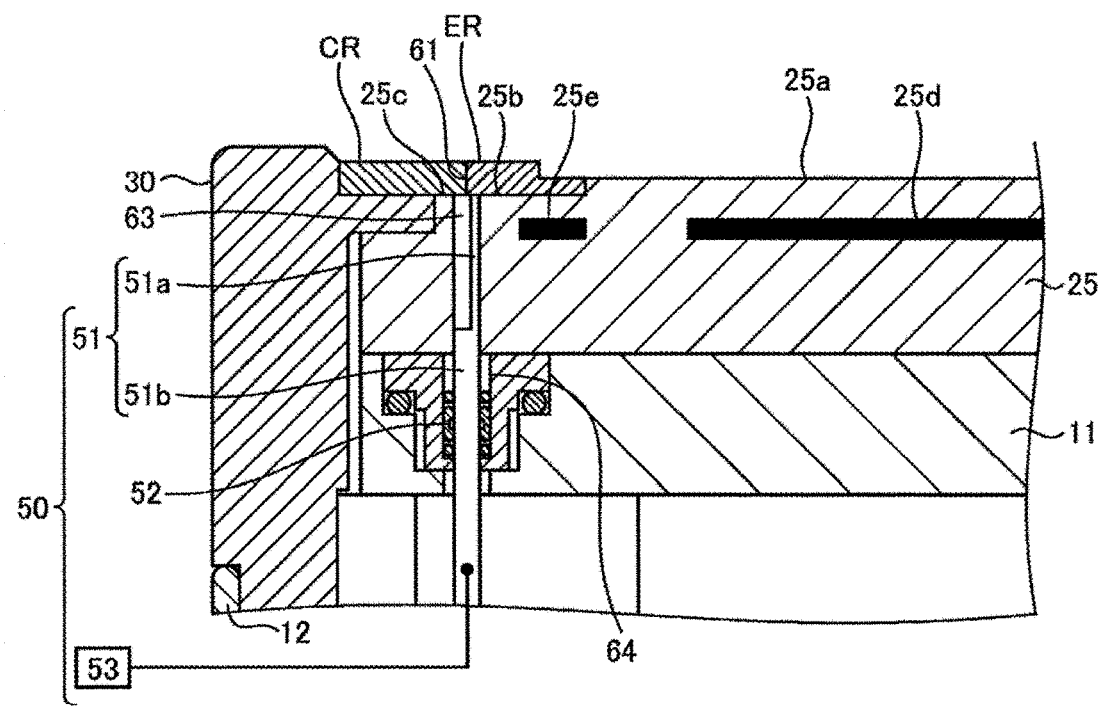
FIG. 3A shows an example of a state at the time of starting transfer of an edge ring by the transfer mechanism according to the embodiment.

Next, the transfer of the edge ring ER by the transfer mechanism 50 according to the embodiment will be described with reference to FIGS. 3A to 3D. In the example of FIGS. 3A to 3D, the transfer mechanism 50 transfers the edge ring ER in a state where the lifter pin 51 is located at the first position. FIG. 3A shows an example of a state at the time of starting transfer of the edge ring ER by the transfer mechanism 50 according to the embodiment.

As shown in FIG. 3A, the lifter pin 51 is accommodated in the holes 63 and 64 except during the transfer. In the example of FIG. 3A, the far end of the lifter pin 51 is in contact with the bottom surface of the edge ring ER. However, the lifter pin 51 may be accommodated at a position where the lifter pin 51 is not in contact with the edge ring ER.

Figure 3B:
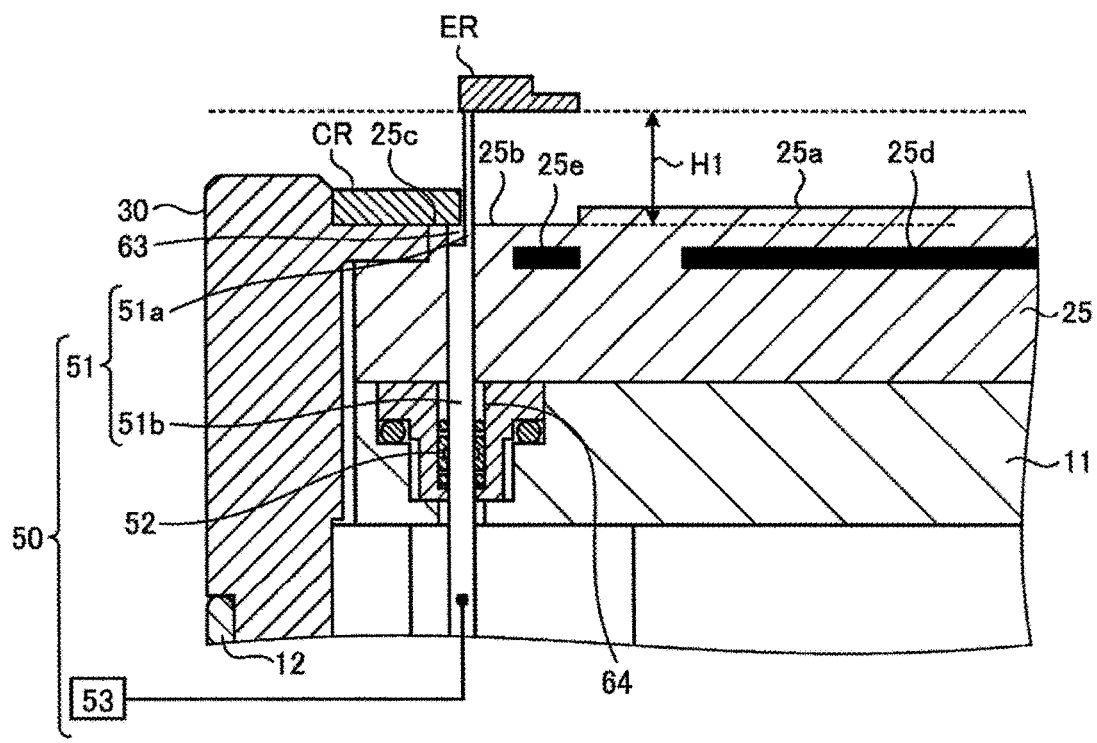
FIG. 3B shows an example of a state in which the edge ring is lifted by the transfer mechanism according to the embodiment.

FIG. 3B shows an example of a state in which the edge ring ER is raised by the transfer mechanism 50 according to the embodiment. In order to transfer the edge ring ER, first, the driving mechanism 53 is driven to lift the lifter pin 51 upward. When the lifter pin 51 is lifted, first, the far end of the first holding portion 51a reaches the surface of the substrate support and becomes in contact with the bottom surface of the edge ring ER. When the lifter pin 51 is lifted, the edge ring ER juts out from the inner peripheral portion 25b of the electrostatic chuck 25 and raised upward by the lifter pin 51. The driving mechanism 53 raises the far end of the lifter pin 51 to a preset first transfer height H1. The first transfer height H1 will be described later.

Figure 3C:
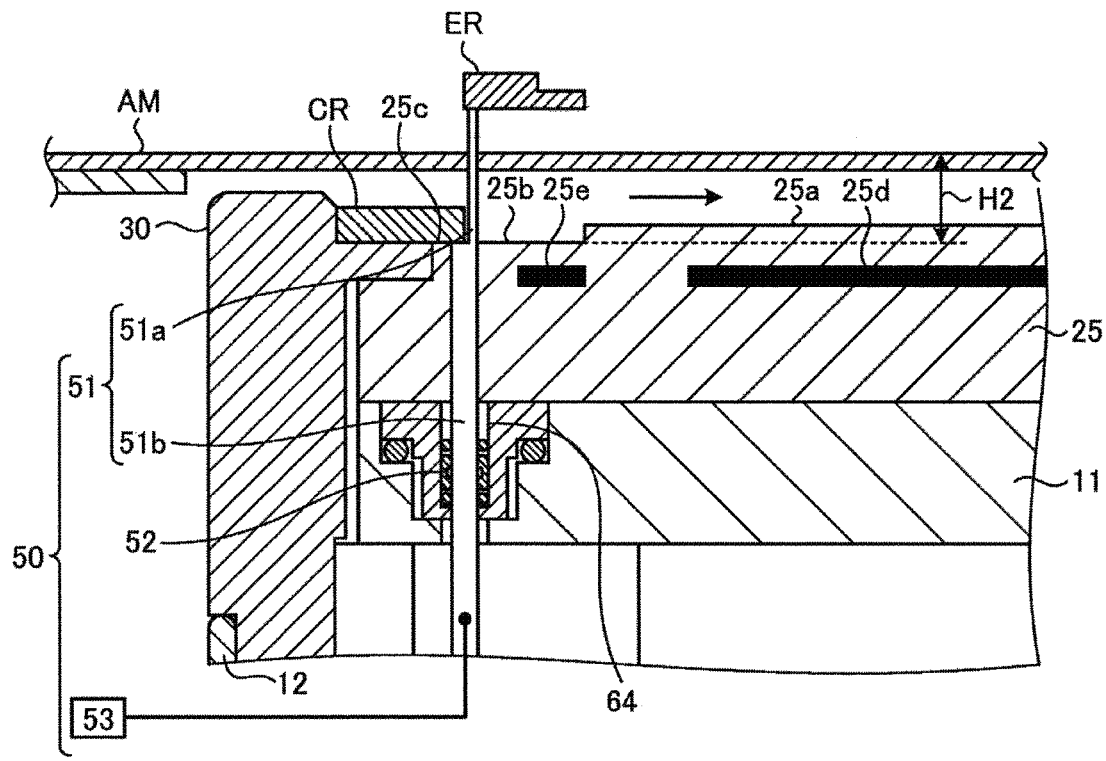
FIG. 3C shows an example of a state immediately before the edge ring lifted by the transfer mechanism according to the embodiment is placed on a robot arm.

FIG. 3C shows an example of a state immediately before the edge ring ER raised by the transfer mechanism 50 according to the embodiment is placed on a robot arm AM. After the edge ring ER is raised to the first transfer height H1 by the lifter pin 51, the controller 43 causes the transfer robot arm AM to enter the processing chamber 10 and be positioned above the susceptor 11. The robot arm AM moves forward in the horizontal direction so that the upper surface of the robot arm AM is located at a height H2 lower than the first transfer height H1. When the robot arm AM is positioned below the edge ring ER raised by the lifter pin 51, the driving mechanism 53 starts to lower the lifter pin 51. When the lifter pin 51 is lowered, the edge ring ER held on the lifter pin 51 is placed on the upper surface of the robot arm AM.

Figure 3D:
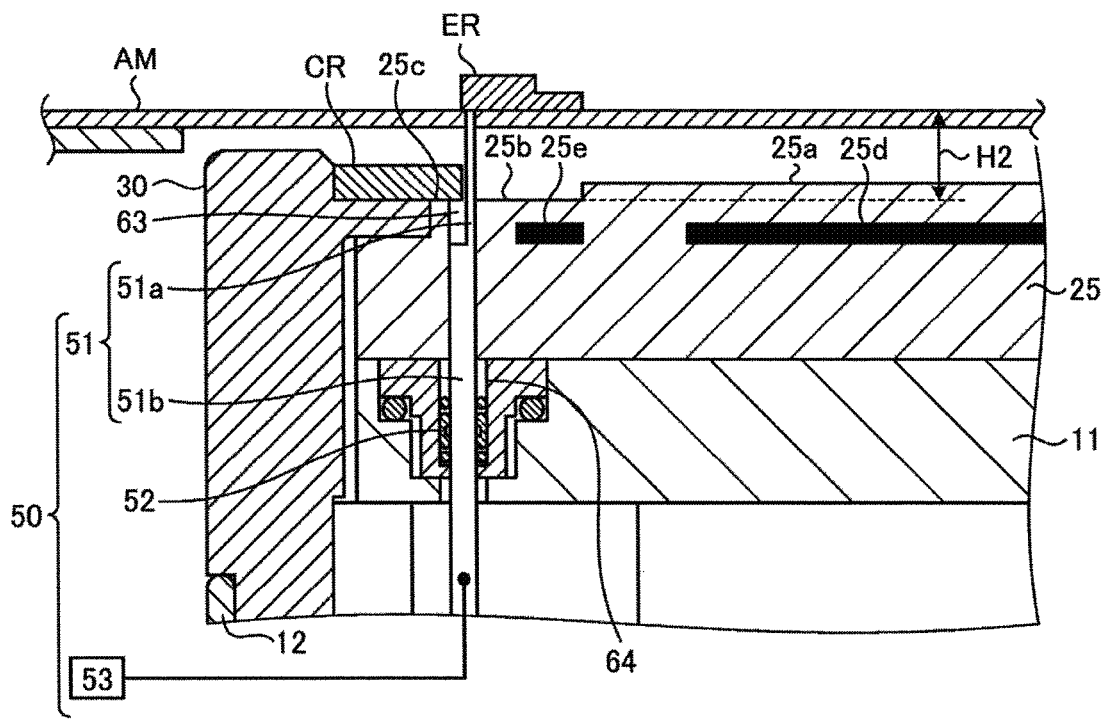
FIG. 3D shows an example of a state in which the edge ring lifted by the transfer mechanism according to the embodiment is placed on the robot arm.

FIG. 3D shows an example of a state in which the edge ring ER raised by the transfer mechanism 50 according to the embodiment is placed on the robot arm AM. After the edge ring ER is placed on the robot arm AM, the lifter pin 51 is further lowered to a position lower than the height H2. When the lifter pin 51 is accommodated into the holes 63 and 64, the controller 43 moves the robot arm AM on which the edge ring ER is placed to the outside of the processing chamber 10.

(Transfer of the Cover Ring CR)

Figure 4A:
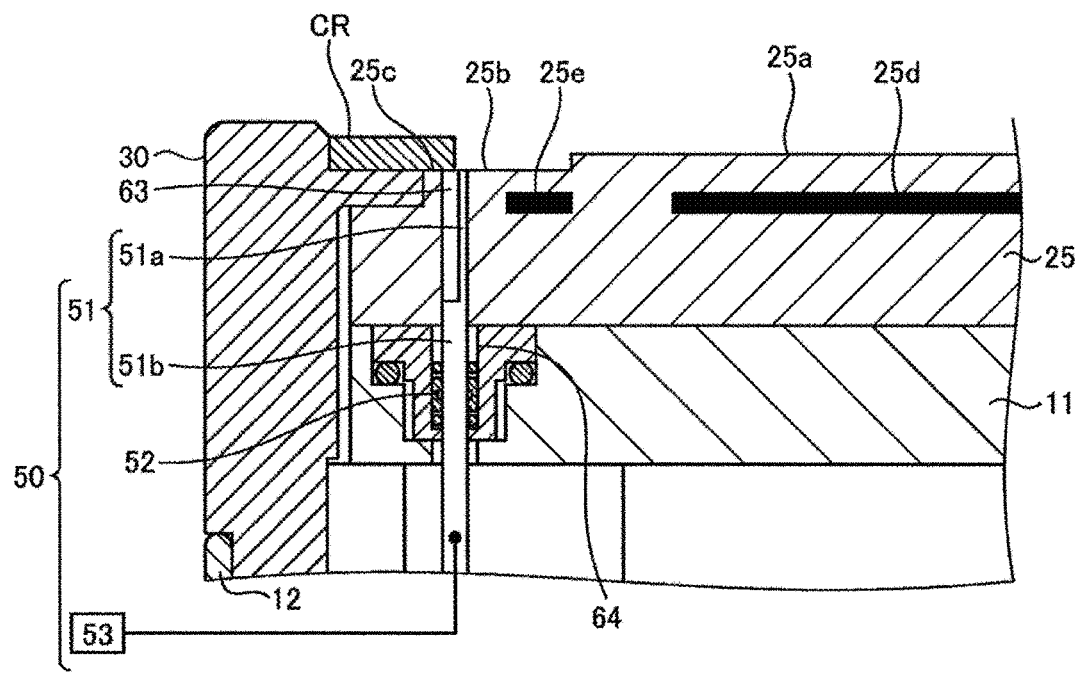
FIG. 4A shows an example of a state at the time of starting transfer of a cover ring by the transfer mechanism according to the embodiment.

Next, the transfer of the cover ring CR by the transfer mechanism 50 according to the embodiment will be described with reference to FIGS. 4A to 4D. In the example of FIGS. 4A to 4D, the transfer mechanism 50 transfers the cover ring CR in a state where the lifter pin 51 is located at the first position. FIG. 4A shows an example of a state at the time of starting transfer of the cover ring CR by the transfer mechanism 50 according to the embodiment.

The unloading of the cover ring CR shown in FIG. 4A is performed in a state where the wafer W and the edge ring ER are not placed on the substrate support. The lifter pin 51 is located at the first position.

Figure 4B:
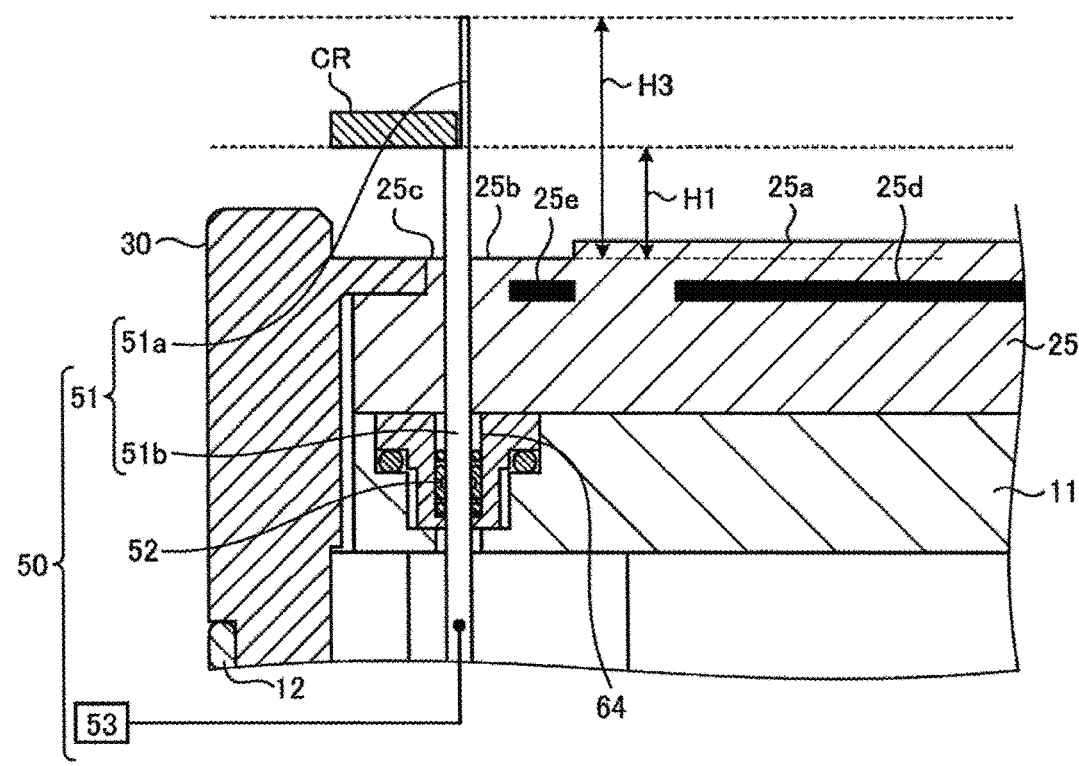
FIG. 4B shows an example of a state in which the cover ring is lifted by the transfer mechanism according to the embodiment.

FIG. 4B shows an example of a state in which the cover ring CR is raised by the transfer mechanism 50 according to the embodiment. Unlike the case of transferring the edge ring ER, in the case of transferring the cover ring CR, the driving mechanism 53 is driven to lift the far end of the lifter pin to a second transfer height H3 higher than the first transfer height H1. When the lifter pin 51 is gradually lifted by the driving mechanism 53, first, the first holding portion 51a passes through the surface of the substrate support and, then, the far end surface of the second holding portion 51b is brought into contact with the bottom surface of the cover ring CR. When the lifter pin 51 is further lifted in a state where the far end surface of the second holding portion 51b is in contact with the bottom surface of the cover ring CR, the cover ring CR juts out from the outer peripheral portion 25c of the electrostatic chuck 25 and raised upward. The driving mechanism 53 further raises the far end of the lifter pin 51 to the second transfer height H3. Accordingly, the far end of the second holding portion 51b, i.e., the bottom surface of the cover ring CR, is located at the first transfer height H1.

Figure 4C:
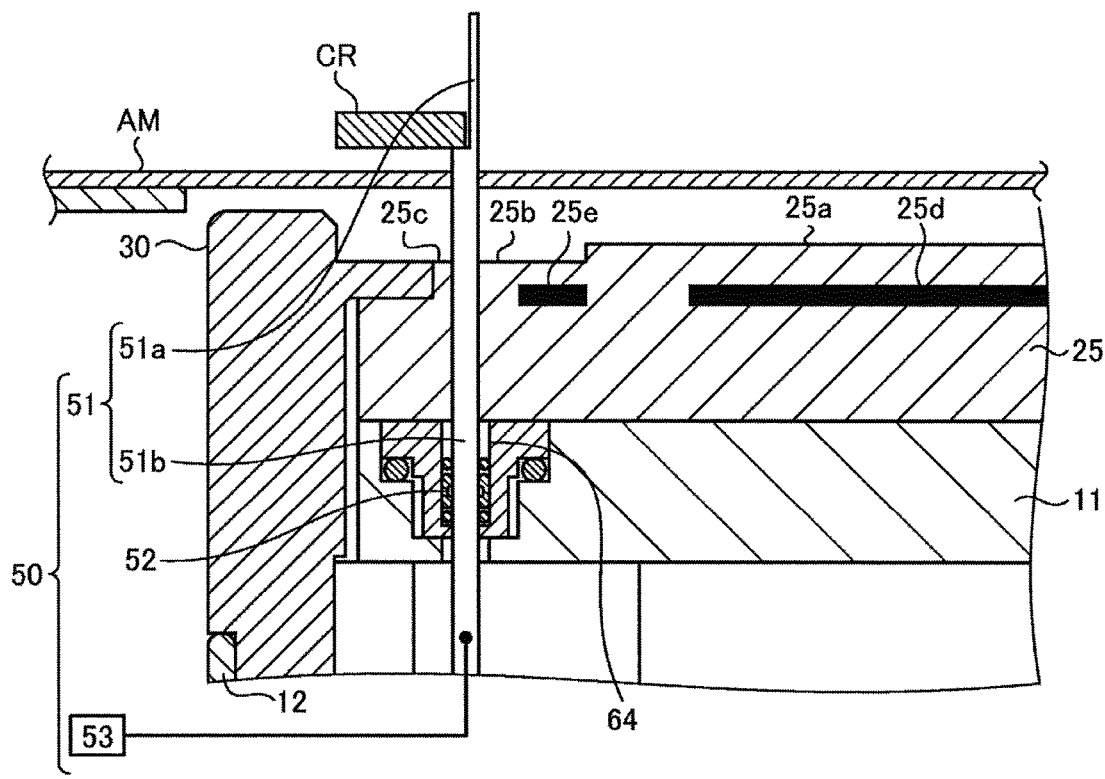
FIG. 4C shows an example of a state immediately before the cover ring lifted by the transfer mechanism according to the embodiment is placed on the robot arm.

FIG. 4C shows an example of a state immediately before the cover ring CR raised by the transfer mechanism 50 according to the embodiment is placed on the robot arm AM. After the cover ring CR is raised to the first transfer height H1 by the lifter pin 51, the controller 43 causes the transfer robot arm AM to enter the processing chamber 10 and be positioned above the susceptor 11. The robot arm AM move forward in the horizontal direction so that the upper surface of the robot arm AM is located at the height H2 lower than the first transfer height H1. When the robot arm AM is positioned below the cover ring CR raised by the lifter pin 51, the driving mechanism 53 starts to lower the lifter pin 51. When the lifter pin 51 is lowered and the far end surface of the second holding portion 51b reaches the height H2, the cover ring CR held on the lifter pin 51 is placed on the robot arm AM.

Figure 4D:
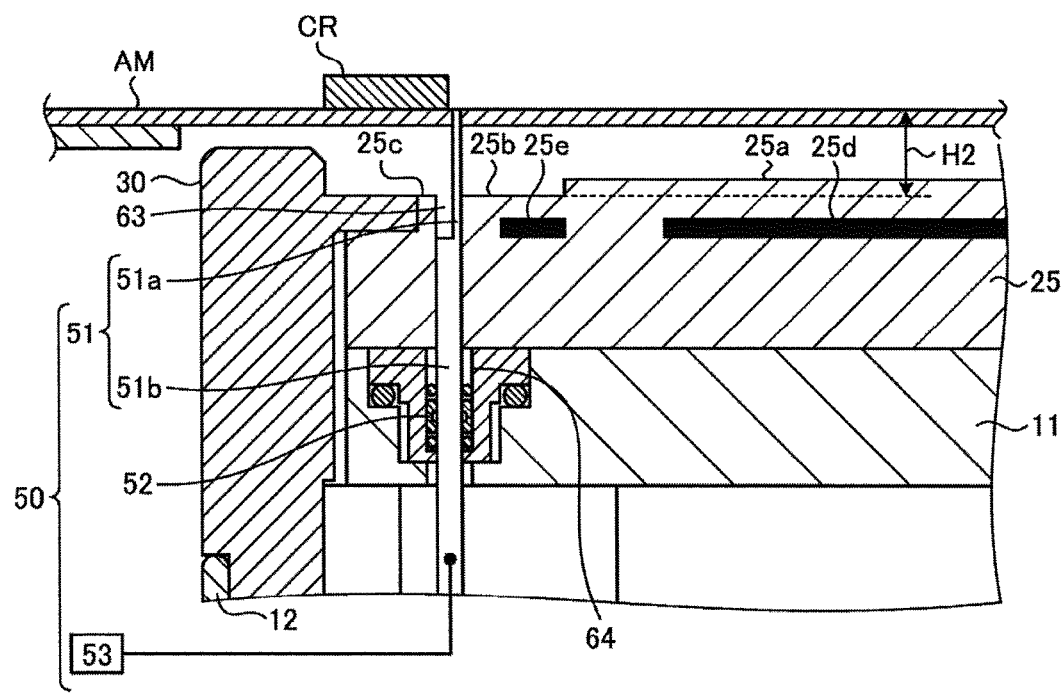
FIG. 4D shows an example of a state in which the cover ring lifted by the transfer mechanism according to the embodiment is placed on the robot arm.

FIG. 4D shows an example of a state in which the cover ring CR raised by the transfer mechanism 50 according to the embodiment is placed on the robot arm AM. After the cover ring CR is placed on the robot arm, the lifter pin 51 is further lowered, and the far end surface of the first holding portion 51a moves to a position lower than the height H2. When the lifter pin 51 is accommodated into the holes 63 and 64, the controller 43 moves the robot arm AM on which the cover ring CR is placed to the outside of the processing chamber 10.

As described above, in the transfer mechanism 50 according to the embodiment, the lifter pin 51 is located at the first position, and the lifting amount of the lifter pin 51 is set to be different between the case of transferring the edge ring ER and the case of transferring the cover ring CR. Accordingly, the transfer mechanism 50 transfers both of the edge ring ER and the cover ring CR using the same lifter pin 51. Therefore, the lifter pin 51 includes the first holding portion 51a and the second holding portion 51b disposed on the base end side of the first holding portion 51a. The second holding portion 51b has a cross section larger than that of the first holding portion 51a and projects in the circumferential direction of the first holding portion 51a. The hole 63 is formed in the surface of the substrate support to correspond to the boundary between the edge ring ER and the cover ring CR placed on the substrate support.

(Simultaneous Unloading of the Edge Ring ER and the Cover Ring CR)

FIGS. 3A to 3D and 4A to 4D show the case where the edge ring ER and the cover ring CR are transferred separately. However, the present disclosure is not limited thereto, and the transfer mechanism 50 may simultaneously lift the edge ring ER and the cover ring CR and deliver them to the robot arm AM.

For example, in FIG. 4A, the transfer process is started in a state where the edge ring ER as well as the cover ring CR are placed on the electrostatic chuck 25. When the far end of the first holding portion 51a reaches the surface of the substrate support, first, the edge ring ER is raised by the far end surface of the first holding portion 51a. When the lifter pin 51 is further lifted, the far end surface of the second holding portion 51b is brought into contact with the bottom surface of the cover ring CR. When the lifter pin 51 is further lifted, the edge ring ER held on the first holding portion 51a and the cover ring CR held on the second holding portion 51b are simultaneously raised (see FIG. 4B). In this state, the robot arm AM enters the processing chamber 10. First, the far end surface of the second holding portion 51b is lowered to the height H2. The cover ring CR is placed on the robot arm AM. At this point, the robot arm AM is retracted to the outside of the processing chamber 10 to unload the cover ring CR. Then, the robot arm AM enters the processing chamber 10 again. Then, the lifter pin 51 is further lowered. The edge ring ER is still held on the first holding portion 51a of the lifter pin 51. When the far end surface of the first holding portion 51a is lowered to the height H2, the edge ring ER is placed on the robot arm AM. The lifter pin 51 is further lowered and accommodated into the hole 63. Then, the robot arm AM is retracted to the outside of the processing chamber 10 to unload the edge ring ER.

As described above, the transfer mechanism 50 can simultaneously raise and unload the cover ring CR and the edge ring ER using the lifter pin 51. Therefore, in the present embodiment, it is possible to reduce the time required for the transfer process by eliminating the trouble of raising and lowering the lifter pin from an accommodating position whenever the consumable members are unloaded.

(Transfer of the Cover Ring CR in a State where the Lifter Pin is Located at the Second Position)

Figure 5A:
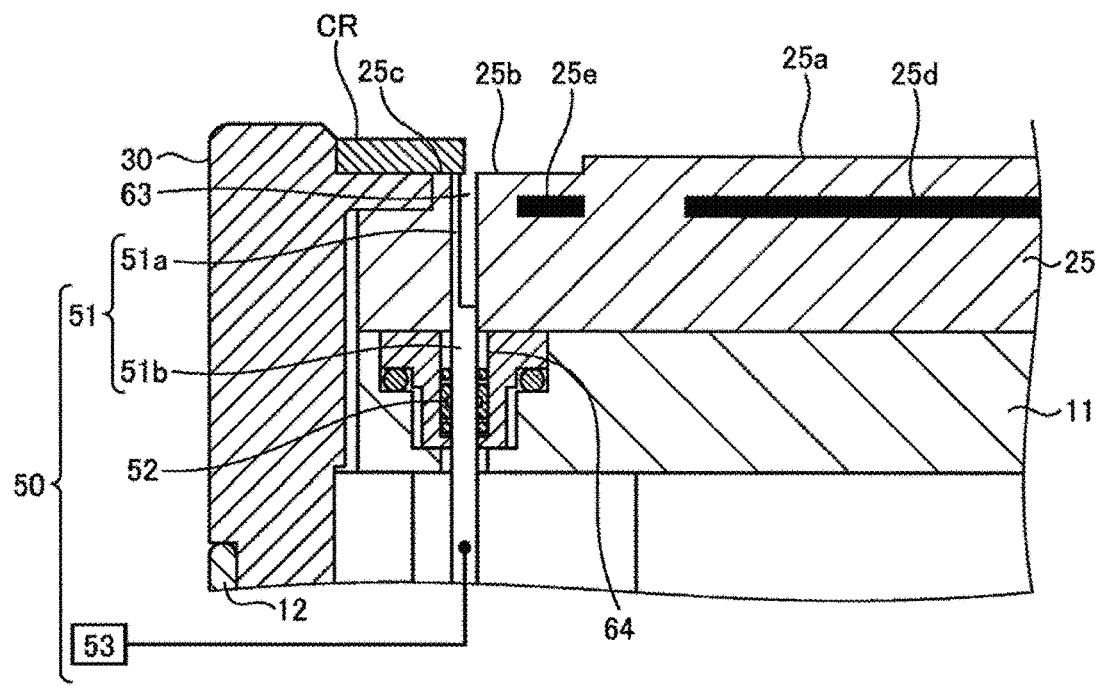
FIG. 5A shows a second example of a state at the time of starting transfer of the cover ring by the transfer mechanism according to the embodiment.

Next, another example of transferring the cover ring CR by the transfer mechanism 50 according to the embodiment will be described with reference to FIGS. 5A to 5D. In the example of FIGS. 5A to 5D, the transfer mechanism 50 transfers the cover ring CR in a state where the lifter pin 51 is located at the second position. FIG. 5A shows a second example of a state at the time of starting transfer of the cover ring CR by the transfer mechanism 50 according to the embodiment.

The unloading of the cover ring CR shown in FIG. 5A can also be performed when the wafer W and the edge ring ER are placed on the substrate support. For simplicity of illustration, FIG. 5A shows a state in which the wafer W and the edge ring ER are not placed on the substrate support. The lifter pin 51 is located at the second position, and the first holding portion 51a is provided at a position rotated by 180 degrees from the position shown in FIG. 3A.

Figure 5B:
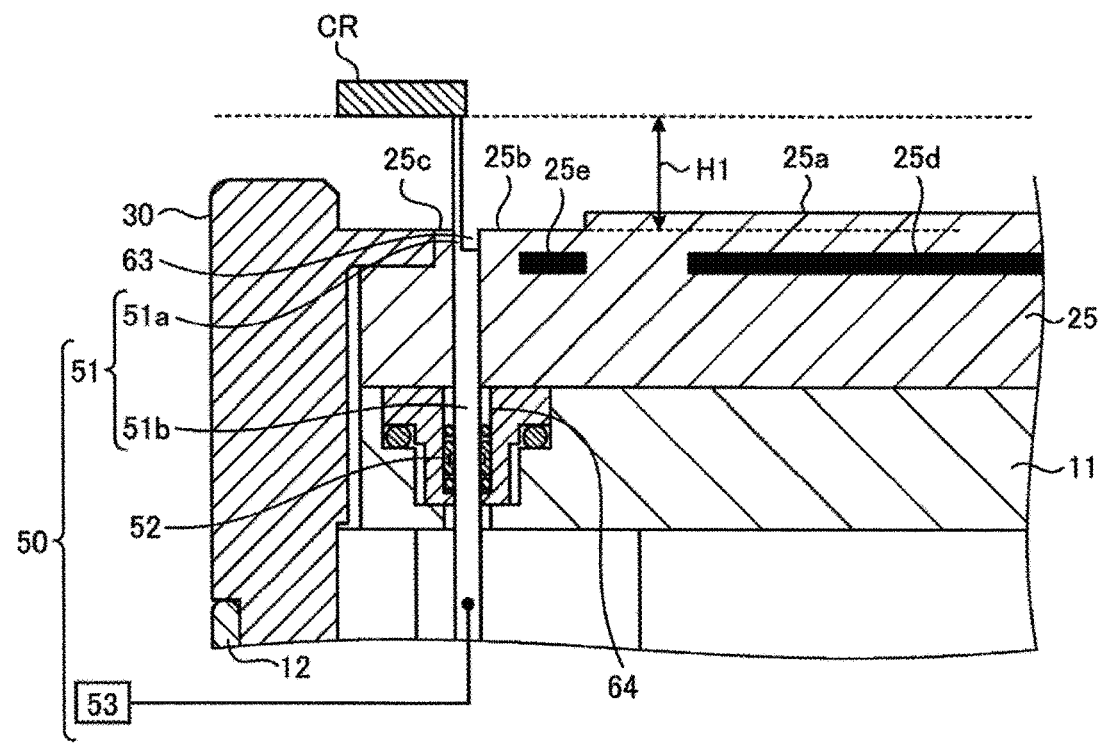
FIG. 5B shows a second example of a state in which the cover ring is lifted by the transfer mechanism according to the embodiment.

FIG. 5B shows a second example of a state in which the cover ring CR is raised by the transfer mechanism 50 according to the embodiment. Unlike the case when the lifter pin 51 is located at the first position (see FIG. 4B), when the lifter pin 51 is located at the second position, the driving mechanism 53 raises the far end of the lifter pin 51 to the first transfer height H1 lower than the second transfer height H3. As the lifter pin 51 is lifted, the far end surface of the first holding portion 51a is brought into contact with the bottom surface of the cover ring CR. When the lifter pin 51 is further lifted, the cover ring CR juts out from the substrate support surface. Accordingly, the far end of the first holding portion 51a, i.e., the bottom surface of the cover ring CR, is raised to the first transfer height H1.

Figure 5C:
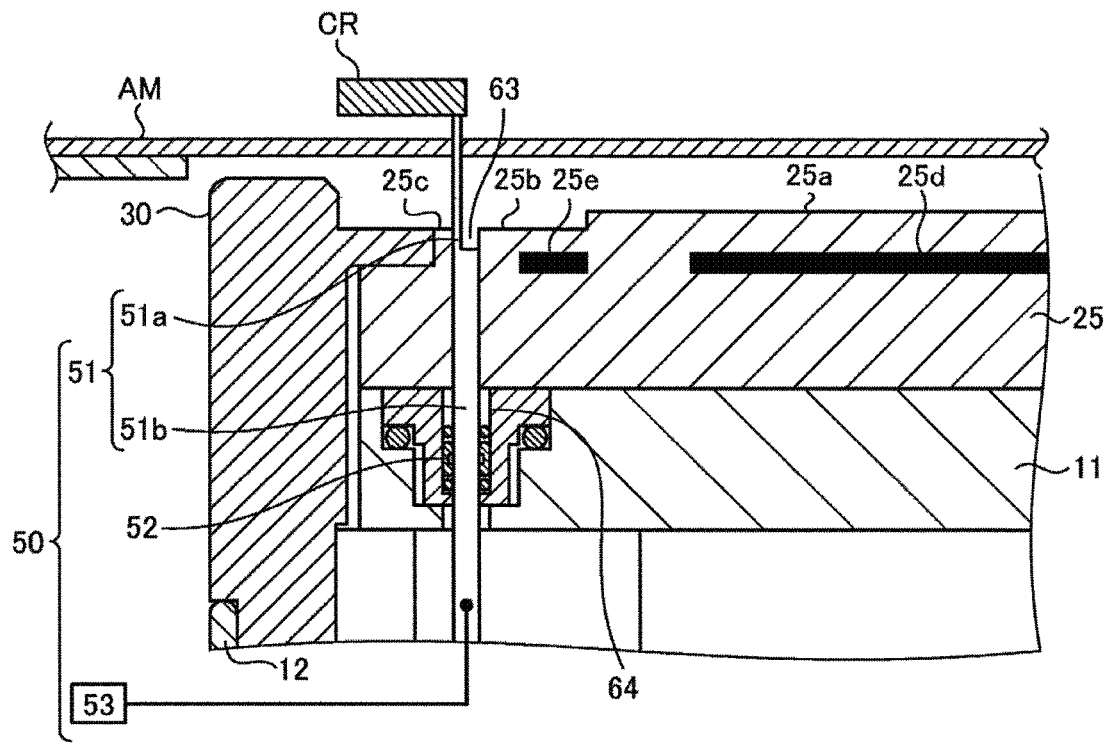
FIG. 5C shows a second example of a state immediately before the cover ring lifted by the transfer mechanism according to the embodiment is placed on the robot arm.

FIG. 5C shows a second example of a state immediately before the cover ring CR raised by the transfer mechanism 50 according to the embodiment is placed on the robot arm AM. After the cover ring CR is raised to the first transfer height H1 by the lifter pin 51, the controller 43 causes the transfer robot arm AM to enter the processing chamber 10 and be positioned above the susceptor 11. The robot arm AM moves forward in the horizontal direction so that the upper surface of the robot arm AM is located at the height H2 lower than the first transfer height H1. When the robot arm AM is positioned below the cover ring CR raised by the lifter pin 51, the driving mechanism 53 starts to lower the lifter pin 51. When the lifter pin 51 is lowered and the far end surface of the first holding portion 51a reaches the height H2, the cover ring CR held on the lifter pin 51 is placed on the robot arm AM.

Figure 5D:
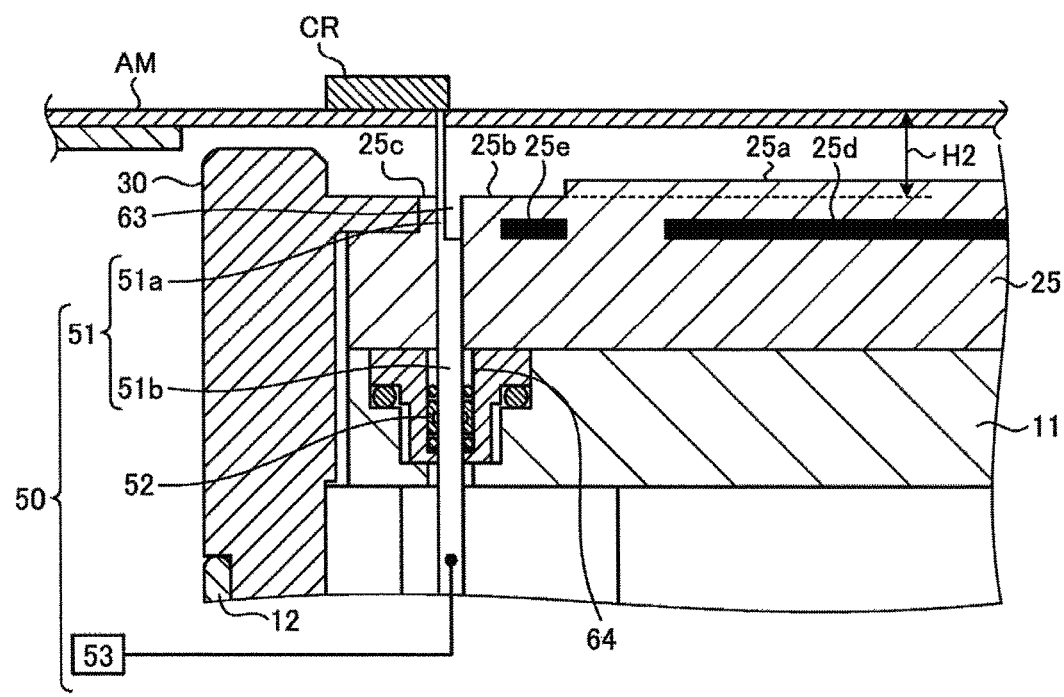
FIG. 5D shows a second example of a state in which the cover ring lifted by the transfer mechanism according to the embodiment is placed on the robot arm.

FIG. 5D shows a second example of a state in which the cover ring CR raised by the transfer mechanism 50 according to the embodiment is placed on the robot arm AM. After the cover ring CR is placed on the robot arm, the lifter pin 51 is further lowered, and the far end surface of the first holding portion 51a is moved to a position lower than the height H2. When the lifter pin 51 is accommodated into the holes 63 and 64, the controller 43 moves the robot arm AM on which the cover ring CR is placed to the outside of the processing chamber 10.

As described above, in the transfer mechanism 50 according to the embodiment, the lifter pin 51 can be moved vertically in two different arrangements, i.e., the first position and the second position. Therefore, when it is desired to transfer only the cover ring CR, the transfer mechanism 50 can transfer the cover ring CR by suppressing the lifting amount of the lifter pin 51 in a state where the lifter pin 51 is provided at the second position. Accordingly, the transfer mechanism 50 can suppress the time required for the lifting operation of the lifter pin 51 and reduce the downtime of the plasma processing apparatus.

Further, in accordance with the transfer mechanism 50 of the present embodiment, when the edge ring ER and the cover ring CR are placed on the substrate support, it is possible to eliminate the trouble of moving one of the edge ring ER and the cover ring CR and then transferring the other one.

FIGS. 6A to 6F explains a relationship between a length of each part of the lifter pin 51, transfer heights, and a thickness of the cover ring CR. In FIGS. 6A to 6F, the first transfer height H1 and the second transfer height H3 will be described using the upper surfaces of the inner peripheral portion 25b and the outer peripheral portion 25c of the electrostatic chuck 25 as the reference plane. First, the length L1 of the first holding portion 51a is set to be substantially the same as the first transfer height H1 (see FIG. 6A). Further, the second transfer height H3 is approximately twice the first transfer height H1. When the driving mechanism 53 holds and transfers (raises/lowers) the cover ring CR or the edge ring ER with the far end surface of the first holding portion 51a, the driving mechanism 53 raises the far end of the first holding portion 51a to the first transfer height H1 (see FIG. 6B). Further, when the cover ring CR is held and transferred by the far end surface of the second holding portion 51b, the far end of the first holding portion 51a is raised to the second transfer height H3 (see FIG. 6C). In the example of FIGS. 6A to 6F, the length L1 of the first holding portion 51a is set to be substantially the same as the first transfer height H1. Further, the second transfer height H3 is set to be approximately twice the first transfer height. Accordingly, in the present embodiment, the control state in the case of transferring the edge ring ER in a state where the lifter pin 51 is located at the first position and the control state in the case of transferring the cover ring CR in a state where the lifter pin 51 is located at the first position can be commonized.

Further, in the present embodiment, when the lifter pin 51 is located at the first position, the cover ring CR and the edge ring ER may be raised at the same time. Therefore, the lengths of the first holding portion 51a and the second holding portion 51b are set to avoid interference with the edge ring ER when the lifter pin 51 is raised to the first transfer height H1 and then lowered to unload the cover ring CR. FIG. 6D shows a state in which the edge ring ER and the cover ring CR are simultaneously raised by the lifter pin 51. The far end surface of the first holding portion 51a is located at the second transfer height H3. The far end surface of the second holding portion 51b is located at the first transfer height H1. When the transfer mechanism 50 unloads the cover ring CR while holding the edge ring ER on the lifter pin 51, the lifter pin 51 is lowered to the height shown in FIG. 6E. The far end of the first holding portion 51a is located at the first transfer height H1. On the other hand, the cover ring CR is held on the upper surface of the robot arm AM located at the height H2. At this time, if the thickness of the cover ring CR is greater than the difference between the first transfer height H1 and the height H2, the cover ring CR that is being transferred and the edge ring ER held on the first holding portion 51a may collide with each other. Therefore, in the example of FIGS. 6A to 6F, the difference between the first transfer height H1 and the height H2 is set to be greater than the thickness of the cover ring CR. Also in the case of locating the lifter pin 51 at the second position and raising the cover ring CR, similarly to the case of locating the lifter pin 51 at the first position, the transfer mechanism 50 raises the first holding portion 51a to the first transfer height H1 and transfers the cover ring CR (see FIG. 6F).

In the present embodiment, the heights H1 and H3 at which the lifter pin 51 is stopped during transfer, the height H2 at which the robot arm AM enters, and the length L1 of the first holding portion 51a are set as described above. Therefore, it is not necessary to change the position at which the lifter pin 51 is raised and stopped depending on whether the lifter pin 51 is located at the first position or the second position, and a simple unloading operation can be performed by the transfer mechanism 50. Further, in the present embodiment, it is not necessary to change the height of the robot arm AM depending on the types of the consumable members to be transferred, and different consumable members can be transferred by the same operation. As described above, with the configuration of the embodiment, a plurality of consumable members can be easily transferred by one transfer mechanism 50.

However, the dimension of each part of the lifter pin 51 and the lifting amount of the lifter pin 51 during transfer are not limited to those described above. The dimension of each part of the lifter pin 51 and the lifting amount of the lifter pin 51 during transfer can be adjusted depending on the dimension of each part of the component placed on the substrate support and the performance of the robot arm AM.

(Sequence of the Transfer Process)

The degree of consumption and the frequency of replacement of the cover ring CR and the edge ring ER vary. The edge ring ER is close to the wafer W, and thus is greatly affected by plasma. Further, the degree of consumption of the edge ring ER greatly affects the process performance. Compared to the edge ring ER, the cover ring CR is consumed slowly and less affects the process performance. Therefore, a plurality of edge ring ERs is often replaced during a period in which one cover ring CR is replaced. Therefore, the replacement timing of the cover ring CR and the edge ring ER may be preset and stored in the controller 43 or the like, so that the cover ring CR and the edge ring ER can be automatically unloaded by the transfer mechanism 50 when the replacement timing arrives. Further, whether to locate the lifter pin 51 at the first position or the second position in the transfer process of each replacement timing may be preset.

For example, it is possible to replace the cover ring CR once after the edge ring ER is replaced four times. In this case, the lifter pin 51 may be located at the first position at the time of replacing the edge ring ER. The lifter pin 51 may be located at the second position at the time of replacing the cover ring CR. Further, for example, the edge ring ER and the cover ring CR can be replaced simultaneously once after the edge ring ER is replaced four times. In this case, all the five replacement processes may be performed in a state where the lifter pin 51 may be located at the first position.

FIG. 7 is a flowchart showing an example of the sequence of the transfer process performed by the transfer mechanism according to the embodiment. In the example of FIG. 7, the replacement of both of the edge ring ER and the cover ring CR is controlled by one controller 43 (see FIG. 1). The sequence of the transfer process is stored in advance in the controller 43.

First, the execution timing of the transfer process arrives. The method by which the controller 43 detects the arrival of the execution timing is not particularly limited. For example, the controller 43 may detect the arrival of the execution timing from an input of an operator. Further, the controller 43 may determine the execution timing at a preset timing.

The controller 43 determines whether or not to unload the edge ring ER and the cover ring CR simultaneously (step S700). When it is determined to unload the edge ring ER and the cover ring CR simultaneously (step S700, Yes), the controller 43 controls the transfer mechanism 50 to locate the lifter pin 51 at the first position (step S710). Then, the controller 43 raises the far end of the lifter pin 51 to the second transfer height H3 (step S711). While the lifter pin 51 is being lifted to the second transfer height H3, first, the first holding portion 51a is brought into contact with the edge ring ER and raises the edge ring ER. Further, the second holding portion 51b is brought into contact with the cover ring CR and raises the cover ring CR.

The controller 43 controls the robot arm AM to enter the processing chamber 10 and be positioned below the cover ring CR (see FIG. 4C). Then, the controller 43 gradually lowers the lifter pin 51 to the first transfer height H1 (step S712). Then, the cover ring CR is placed on the robot arm AM. At this point, the controller 43 retracts the robot arm AM to the outside of the processing chamber 10. The robot arm AM unloads the cover ring CR to the outside of the processing chamber 10.

Next, the controller 43 controls the robot arm AM to enter the processing chamber 10 and be positioned below the edge ring ER again (see FIG. 3C). Then, the controller 43 further lowers the lifter pin 51 to the retracted position (step S713). While the lifter pin 51 is being lowered, the edge ring ER is placed on the robot arm AM. The controller 43 further lowers the lifter pin 51 to a retracted position (inside the substrate support). The controller 43 retracts the robot arm AM on which the edge ring ER is placed to the outside of the processing chamber 10. The robot arm AM unloads the edge ring ER to the outside of the processing chamber 10.

On the other hand, when it is determined in step S700 that the edge ring ER and the cover ring CR are not unloaded simultaneously (step S700, No), the controller 43 determines whether to replace only the edge ring ER (step S720). When it is determined that only the edge ring ER is to be replaced (step S720, Yes), the controller 43 locates the lifter pin 51 at the first position (step S721). Next, the controller 43 raises the far end of the lifter pin 51 to the first transfer height H1 (step S722). The first holding portion 51a of the lifter pin 51 is brought into contact with on the edge ring ER while it is being raised, and raises the edge ring ER (see FIG. 3B). The controller 43 controls the robot arm AM to enter the processing chamber 10 and be positioned below the edge ring ER (see FIG. 3C). Then, the controller 43 gradually lowers the lifter pin 51. Then, the edge ring ER is placed on the robot arm AM. The controller 43 further lowers the lifter pin 51 to the retracted position (step S723). Then, the controller 43 controls the robot arm AM to be retracted to the outside of the processing chamber 10. The robot arm AM unloads the edge ring ER to the outside of the processing chamber 10.

On the other hand, when it is determined in step S720 that the edge ring ER is not the only object to be replaced (step S720, No), the controller 43 determines whether or not to replace only the cover ring CR (step S730). When it is determined that only the cover ring CR is to be replaced (step S730, Yes), the controller 43 locates the lifter pin 51 at the second position (step S731). Then, the controller 43 raises the far end of the lifter pin 51 to the first transfer height H1 (step S732). The first holding portion 51a of the lifter pin 51 is brought into contact with the cover ring CR while it is being raised, and raises the cover ring CR (see FIG. 5B). The controller 43 controls the robot arm AM to enter the processing chamber 10 and be positioned below the cover ring CR (see FIG. 5C). Then, the controller 43 gradually lowers the lifter pin 51 to the retracted position (step S733). While the lifter pin 51 is being lowered, the cover ring CR is placed on the robot arm AM. The controller 43 further lowers the lifter pin 51 to the retracted position. Then, the controller 43 controls the robot arm AM to be retracted to the outside of the processing chamber 10. The robot arm AM unloads the cover ring CR to the outside of the processing chamber 10.

On the other hand, if it is determined in step S730 that the cover ring CR is not the only object to be replaced (step S730, No), the controller 43 completes the process. In this manner, the process performed by the transfer mechanism 50 is completed.

As described above, in accordance with the plasma processing device 1 according to the embodiment, the edge ring ER and the cover ring CR can be unloaded by the same transfer mechanism 50. Further, the transfer mechanism 50 can transfer the edge ring ER and the cover ring CR using the same lifter pin 51. Further, the transfer mechanism 50 can unload both of the edge ring ER and the cover ring CR during a single raising/lowering operation of the lifter pin 51. Further, the transfer mechanism 50 can change the arrangement of the lifter pin 51 between the first position and the second position. Therefore, the transfer mechanism 50 can make the lifting distance of the lifter pin 51 at the time of unloading the edge ring ER equal to that at the time of unloading the cover ring CR. Accordingly, the transfer mechanism 50 can make the unloading time of the consumable members the same and reduce the unloading time of the consumable members.

(Consumable Members to be Transferred)

In the above embodiment, the transfer mechanism 50 according to the above-described embodiment transfers the cover ring CR and the edge ring ER. However, the present disclosure is not limited thereto, and the transfer mechanism 50 according to the embodiment can transfer multiple parts of any consumable member or multiple consumable members.

For example, the edge ring ER is divided into two parts, i.e., an inner peripheral part and an outer peripheral part, and an outer circumference of the inner peripheral part and an inner circumference of the outer peripheral part are in contact with each other. Then, a hole is formed in the substrate support to correspond to the boundary between the inner peripheral part and the outer peripheral part. Then, the lifter pin is disposed to be vertically movable in the hole of the substrate support. With this configuration, each part of the edge ring ER can be easily unloaded separately.

(Variation of the Configuration of the Transfer Mechanism)

In the above-described embodiment, the number of the lifter pins 51 is not particularly limited. The edge ring ER and the cover ring CR can be raised and lowered by providing two or more, preferably three or more lifter pins 51. Further, one driving mechanism 53 may be provided for each lifter pin 51, or one driving mechanism 53 may be provided commonly for a plurality of lifter pins 51.

In the above-described embodiment, the inside of the hole and the substrate support are configured to be equipotential space in order to prevent discharge from occurring or discharge from becoming intense in the holes 63 and 64 formed in the electrostatic chuck 25 and the susceptor 11. For example, the neighboring portion of the hole is made of the same metal material as that of the other parts of the substrate support.

Effect of the Embodiment

As shown above, a substrate support and a plasma processing apparatus according to the embodiment includes a wafer placement surface, a ring placement surface, a lifter pin and a driving mechanism. On the wafer placement surface, a wafer is placed. On the ring placement surface, a first ring and a second ring are placed. The second ring is disposed at an outer peripheral side of the first ring without overlapping with the first ring in a vertical direction. The ring placement surface has a hole at a boundary between the first ring and the second ring and is provided at an outer peripheral side of the wafer placement surface. The lifter pin has a first holding portion and a second holding portion. The second holding portion is unitary with and extending axially from a base end of the first holding portion and has a protruding portion protruding from an outer circumference of the first holding portion. The lifter pin is accommodated in the hole of the ring placement surface with the first holding portion facing the ring placement surface. The driving mechanism is configured to raise and lower the lifter pin. Therefore, in accordance with the embodiment, different rings can be held by the first holding portion and the second holding portion of one lifter pin. Therefore, in accordance with the embodiment, the consumable members of the plasma processing apparatus can be easily replaced by one lifter pin. Further, in accordance with the embodiment, a plurality of consumable members can be easily replaced by one lifter pin, and the downtime of the plasma processing apparatus can be reduced. Further, in accordance with the embodiment, when the two rings are placed on the substrate support, the transfer process can be performed without moving one of the rings for the replacement of the other ring. Further, in accordance with the embodiment, since multiple consumable members can be replaced using one lifter pin, the space in the substrate support can be effectively utilized.

Further, in the substrate support according to the embodiment, the first holding portion and the second holding portion are coaxial rod-shaped members, and a cross-sectional area of the first holding portion may be smaller than a cross-sectional area of the second holding portion. Therefore, one of the first ring and the second ring can be held by the first holding portion, and the other one can be held by the protruding portion of the second holding portion. Therefore, in accordance with the embodiment, the consumable members can be efficiently unloaded and replaced.

In the substrate support according to the embodiment, the lifter pin may be rotatable about an axis. Therefore, in accordance with the embodiment, the object held by the first holding portion can be switched between the first ring and the second ring, and then unloaded and replaced.

In the substrate support according to the embodiment, the second holding portion may have a cross section that vertically overlaps with a part of each of the first ring and the second ring placed on the ring placement surface. Further, the first holding portion may have a cross section that vertically overlaps with either the first ring or the second ring placed on the ring placement surface. Therefore, in accordance with the embodiment, two rings can be selectively unloaded and replaced by the first holding portion and the second holding portion.

In the substrate support according to the embodiment, the first ring and the second ring may be made of different materials. For example, the first ring may be an edge ring. The second ring may be a cover ring.

The substrate support according to the embodiment further includes a ring electrostatic chuck and a gas supply mechanism. The ring electrostatic chuck is configured to attract at least one of the first ring and the second ring on the ring placement surface. The gas supply mechanism is configured to supply a heat transfer gas to a gap between a bottom surface of at least one of the first ring and the second ring and the ring placement surface.

In the substrate support according to the embodiment, the driving mechanism is configured to rotate the lifter pin to a first position and a second position. The first position is a position where the first holding portion is disposed at a central side of the substrate support. The second position is a position where the first holding portion is disposed at an outer peripheral side of the substrate support. Further, the driving mechanism is configured to raise and lower the lifter pin by selectively setting an arrangement of the lifter pin to any one of the first position or the second position.

In the substrate support according to the embodiment, the driving mechanism may be configured to locate the lifter pin at the first position and raise a top portion of the lifter pin to a first height during the transfer of the first ring.

In the substrate support according to the embodiment, the driving mechanism is may be configured to locate the lifter pin at the first position and raise the top portion of the lifter pin to a second height higher than the first height during the transfer of the first ring and the second ring.

In the substrate support according to the embodiment, the driving mechanism may be configured to locate the lifter pin at the first position and raise the top portion of the lifter pin to the second height during the transfer of the second ring.

In the substrate support according to the embodiment, the driving mechanism may be configured to locate the lifter pin at the second position and raise the top portion of the lifter pin to the first height during the transfer of the second ring.

Further, a plasma processing apparatus according to the embodiment includes a wafer placement surface, a ring placement surface, a lifter pin and a driving mechanism. On the wafer placement surface, a wafer is placed. On the ring placement surface, a first ring and a second ring are placed. The second ring is disposed at an outer peripheral side of the first ring without overlapping with the first ring in a vertical direction. The ring placement surface has a hole at a boundary between the first ring and the second ring and is provided at an outer peripheral side of the wafer placement surface. The lifter pin has a first holding portion and a second holding portion. The second holding portion is unitary with and extending axially from a base end of the first holding portion and has a protruding portion protruding from an outer circumference of the first holding portion. The lifter pin is accommodated in the hole of the ring placement surface with the first holding portion facing the ring placement surface. The driving mechanism is configured to raise and lower the lifter pin. Therefore, in accordance with the embodiment, different rings can be held by the first holding portion and the second holding portion of one lifter pin.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:
1. A plasma processing apparatus comprising:
a wafer placement surface on which a wafer is placed;
a ring placement surface on which a first ring and a second ring are placed, with the second ring disposed at an outer peripheral side of the first ring without overlapping with the first ring in a vertical direction, the ring placement surface having a hole at a boundary between the first ring and the second ring and provided at an outer peripheral side of the wafer placement surface;

a lifter pin having a first holding portion and a second holding portion, the second holding portion being unitary with and extending axially from a base end of the first holding portion and having a protruding portion protruding from an outer circumference of the first holding portion, and accommodated in the hole of the ring placement surface with the first holding portion facing the ring placement surface; and a driving mechanism configured to raise and lower the lifter pin.

2. A substrate support of a plasma processing apparatus, comprising:

a wafer placement surface on which a wafer is placed;

a ring placement surface on which a first ring and a second ring are placed, with the second ring disposed at an outer peripheral side of the first ring without overlapping with the first ring in a vertical direction, the ring placement surface having a hole at a boundary between the first ring and the second ring and provided at an outer peripheral side of the wafer placement surface;

a lifter pin having a first holding portion and a second holding portion, the second holding portion being unitary with and extending axially from a base end of the first holding portion and having a protruding portion protruding from an outer circumference of the first holding portion, and accommodated in the hole of the ring placement surface with the first holding portion facing the ring placement surface; and a driving mechanism configured to raise and lower the lifter pin.

3. The substrate support of claim 2, wherein the first holding portion and the second holding portion are rod-shaped members, and a cross-sectional area of the first holding portion is smaller than a cross-sectional area of the second holding portion.

4. The substrate support of claim 2, wherein the lifter pin is rotatable about an axis.

5. The substrate support of claim 2, wherein the second holding portion has a cross section that vertically overlaps with a part of each of the first ring and the second ring placed on the ring placement surface, and the first holding portion has a cross section that vertically overlaps with either the first ring or the second ring placed on the ring placement surface.

6. The substrate support of claim 2, wherein the first ring and the second ring are made of different materials.

7. The substrate support of claim 2, further comprising:

a ring electrostatic chuck configured to attract at least one of the first ring and the second ring on the ring placement surface; and a gas supply mechanism configured to supply a heat transfer gas to and the ring placement surface on which at least one of the first ring and the second ring is placed.

8. The substrate support of claim 2, wherein the driving mechanism is configured to rotate the lifter pin to a first position where the first holding portion is disposed at a central side of the substrate support and a second position where the first holding portion is disposed at an outer peripheral side of the substrate support, and the driving mechanism is further configured to raise and lower the lifter pin by selectively setting an arrangement of the lifter pin to any one of the first position or the second position.

9. The substrate support of claim 8, wherein the driving mechanism is configured to locate the lifter pin at the first position and raise a top portion of the lifter pin to a first height during the transfer of the first ring.

10. The substrate support of claim 9, wherein the driving mechanism is also configured to locate the lifter pin at the first position and raise the top portion of the lifter pin to a second height higher than the first height during the transfer of the first ring and the second ring.

11. The substrate support of claim 9, wherein the driving mechanism is also configured to locate the lifter pin at the first position and raise the top portion of the lifter pin to the second height during the transfer of the second ring.

12. The substrate support of claim 9, wherein the driving mechanism is also configured to locate the lifter pin at the second position and raise the top portion of the lifter pin to the first height during the transfer of the second ring.

* * * * *